United States Patent [19]

Lipski et al.

[11] Patent Number: 4,678,907

[45] Date of Patent: Jul. 7, 1987

[54] OPTICAL SCANNER AND SENSOR FOR MONITORING POWER CONSUMPTION

[75] Inventors: Jerzy A. Lipski, Coquitlam; Ian R. Bardsley, Port Coquitlam, both of Canada

[73] Assignee: Microtel Limited, Burnaby, Canada

[21] Appl. No.: 622,897

[22] Filed: Jun. 21, 1984

[51] Int. Cl.⁴ ............................................. G01D 5/34
[52] U.S. Cl. .......................... 250/231 SE; 250/237 G
[58] Field of Search ...................... 250/231 SE, 237 G; 324/175; 340/870.02, 870.03, 870.28, 870.29; 356/395

[56] References Cited

U.S. PATENT DOCUMENTS 4,204,115  5/1980  Boldridge, Jr. ........... 250/231 SE X
4,489,384  12/1984  Hurley et al. ............. 250/231 SE X Primary Examiner—Eugene R. LaRoche
Assistant Examiner—Steven J. Mottola
Attorney, Agent, or Firm—Douglas M. Gilbert

[57] ABSTRACT

An optical scanner/pulse iniator used for deriving power consumption data from a power meter has a pair of light sources modulated by a square wave having a repetition rate R and an OFF period P. The light beams produced by the light sources are positioned to reflect off of spatially separated points on the rotor (disc) in a power meter so that as the rotor rotates a non-reflective stripe will block the light beams one after the other. A first light sensor is positioned to receive the first light beam after being reflected off the rotor and provides an output signal indicating when the first beam is OFF for a period of time that greater than P. A second light sensor is positioned to receive the second light beam after being reflected by the rotor and it also provides an output signal indicating when the second beam is OFF for a period of time greater than P. An output circuit receiving the output signal indications from first and second sensors provides an output pulse upon receiving an indication from each of the first and second light sensors. And, the accumulation of these pulses is the power consumption data required.

12 Claims, 3 Drawing Figures

OPTICAL SCANNER AND SENSOR FOR MONITORING POWER CONSUMPTION

BACKGROUND OF THE INVENTION

This invention relates in general to power monitoring equipment and in particular to an improved method and apparatus for deriving power consumption data from power meters.

Power generating companies often have a need to monitor the consumption rate of individual users. This information may be used for predicting future demand loads, for automatic billing purposes, or for a number of other reasons. There are devices now made that may be installed in power meters, usually electric meters, that will monitor the consumption rate and produce a serial pulse train indicating the rate of usage. These devices, often called pulse initiators, are made by the same companies that manufacture the power meters, and are usually tailored to operate only in conjunction with the meters made by that company.

Generally there are two different techniques used for monitoring consumption from a power meter and to generate pulses therefrom. The first uses a gearing mechanism driven from a rotating gear shaft in the power meter. The second obtains pulses from the rotor (i.e. the rotating disc in the meter by: (1) interruption of an optical signal, (2) interruption of a capacitive coupling mechanism connected in some manner to the rotor, or by (3) reflection of an optical signal. Types (1) and (2) require a special type of rotor which has holes located at strategic locations. This type of design can by used only by manufacturers of power meters since it has to be incorporated in the meters at the manufacturing stage of the product.

Type (3) requires non-reflective stripes or areas to be present on the rotor. Since non-reflective tape or paint is easily added to rotors in existing meters this technique is more universal in nature. Notwithstanding, because of the large variety of meters that have been made and are still in use, there is no single pulse initiator device that will operate reliabily in even most of these power meters now in use. Such devices are also very expensive, at times unreliable, and often cost more than the power meter itself.

OBJECTS AND SUMMARY OF THE INVENTION

It is an object of this invention to provide an inexpensive pulse initiator that may function in a large number of existing power meters made by different manufacturers.

It is another object of this invention to provide a pulse initiator that is resistant to jamming by magnetic and electric fields or by spurious light sources.

It is another object of this invention to provide a pulse initiator that is resistant to mechanical hysteresis and vibration causing improper readings.

These and other objects are achieved with a pulse initiator that has a pair of light sources modulated by a square wave having a repetition rate R and an OFF period P. The light beams produced by the light sources are positioned to reflect off of spatially separated points on the rotor (disc) in the power meter so that as the rotor rotates the non-reflective stripe will block the light beams one after the other. A first light sensor is positioned to receive the first light beam after being reflected off the rotor and provides an indication when the first beam is OFF for a period of time that greater than P. A second light sensor is positioned to receive the second light beam after being reflected by the rotor and provides an indication when the second beam is OFF for a period of time greater than P. An output circuit receiving the indications from first and second sensors provides an output pulse upon receiving an indication from each of the first and second light sensors.

DESCRIPTION OF THE PREFERRED EMBODIMENT

Figure 1:
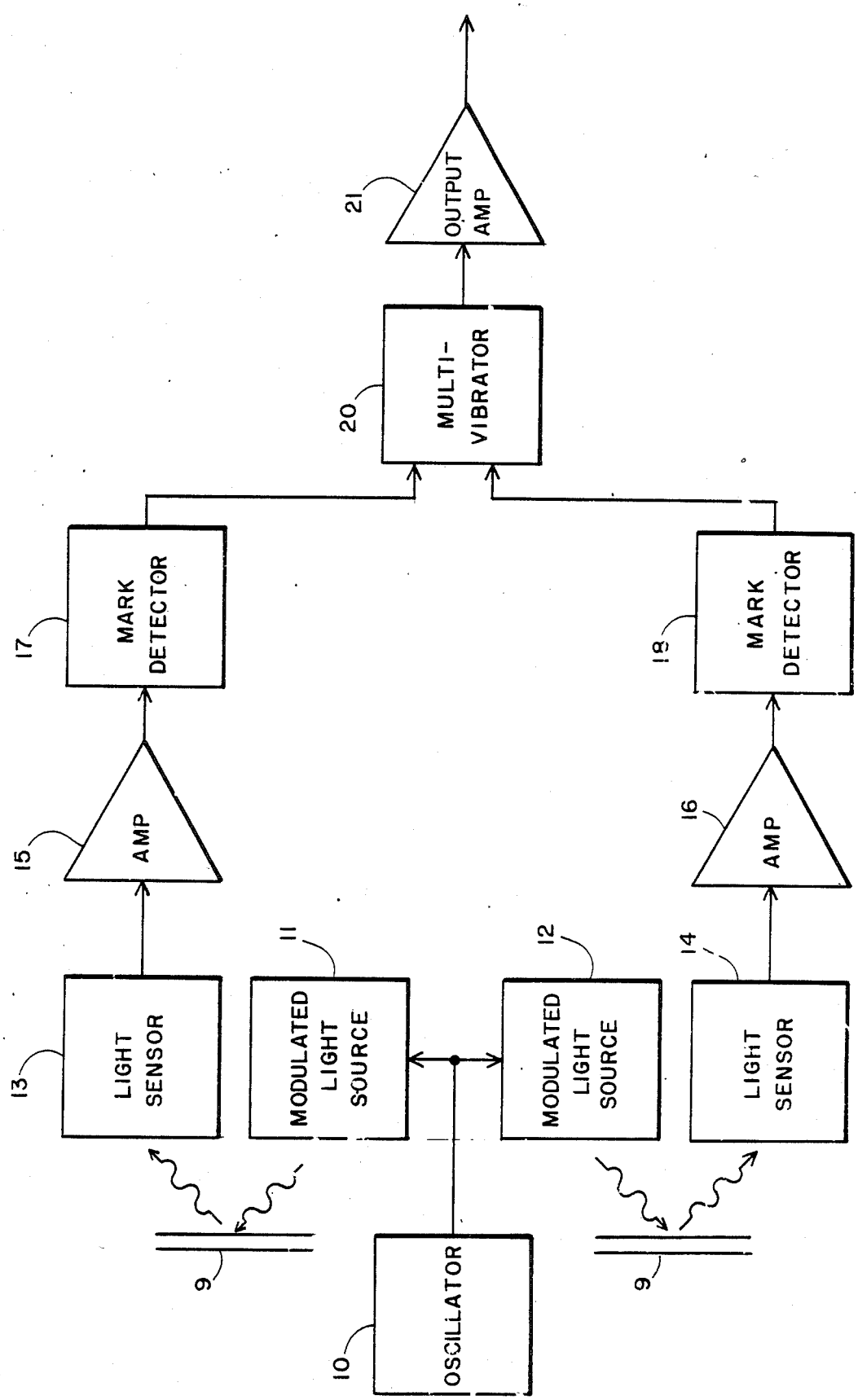
FIG. 1 is a simplified schematic block diagram showing a pulse initiator according to the present invention.
Figure 2:
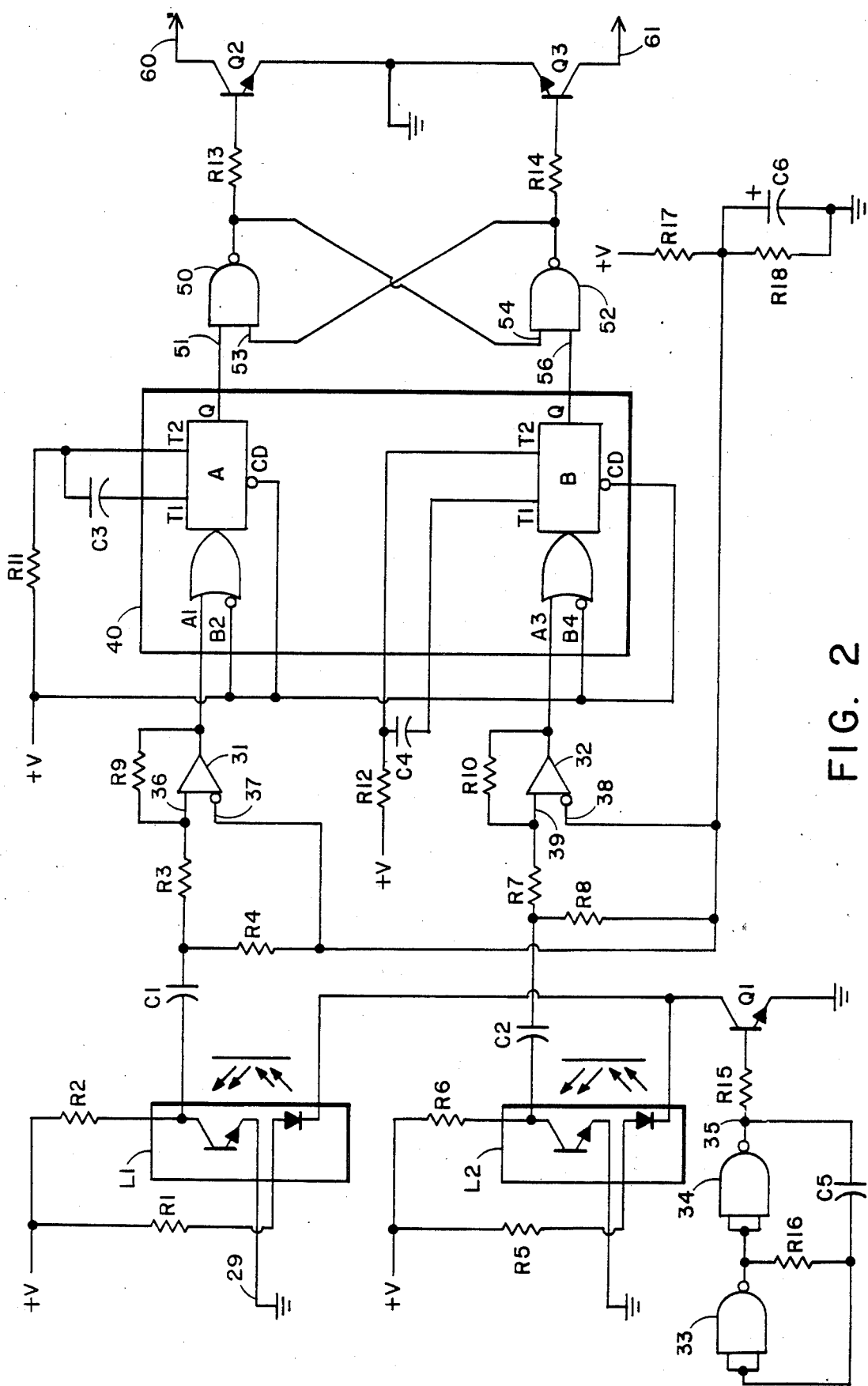
FIG. 2 is a detailed schematic of a pulse initiator circuit according to the present invention.

Referring now to the drawings, FIG. 1 depicts a block diagram that illustrates the functional operation of the circuit shown in FIG. 2. Power meters normally have an internal rotor which is shown pictorially in FIG. 1 as 9. The rotor is usually made of a metal that normally reflects light incident upon the surface thereof. And it can be marked with a non-reflective stripe or spot to block any reflection at the point marked. Such a rotor in a power meter would rotate at a speed proportional to the rate of power consumption by the load.

Oscillator 10 in FIG. 1 produces a square-wave output that modulates two independent light sources 11 and 12 to pulse the light output from 11 and 12 ON and OFF at the rep rate of the oscillator output. The light beams produced by the light sources, shown as undulating lines in FIG. 1, are positioned to reflect off of spatially separated points on the rotor 9 so that as the rotor rotates the non-reflective stripe blocks the light beams one after the other. The reflected light beams are received by light sensors 13 and 14. The sensors in each path convert the beams into electrical signals which are amplified by high gain amplifiers 15 and 16. Since both light beams are modulated by the square-wave output of oscillator 10, the light sensors replicate the same square-wave so long as the light transmission is not blocked. When the rotor 9 rotates the non-reflective surface to the point where one or the other beam is blocked, the signal output from the effected sensor drops to zero.

The function of mark detectors 17 and 18 is to detect the presence or absence of the square-wave signal produced by the light sensors. As long as a signal is present at the input of either detector, the output will remain at a first state (e.g. high). If the square-wave signal is absent for a period longer than a fixed time constant, the output of either detector 17 or 18 will change to a second state (e.g. low). The output stage, consisting of multivibrator 20 and output amplifier 21, produces an ouput pulse when the same state signal is received by both inputs to multivibrator 20. In other words a low pulse on one of the inputs followed by a low pulse signal on the other of the inputs will cause a pulse to be generated by the multivibrator. Output amp 21 performs an interfacing function with the load connected to its output circuit. Thus, in order to produce a complete output pulse, a non-reflective area must traverse both sensors. In passing the first area, the output from sensor 13, for example, drops to zero and the output state of detector 17 goes low. In passing the second area, the output from sensor 14 drops to zero and the output state of detector 18 accordingly goes low. And two inputs of the same state (i.e. one followed by the other) to multivibrator 20 causes a complete pulse to be generated. This order of operation prevents the circuit from producing false pulses due to vibration or mechanical hysteresis.

Referring to the circuit shown in FIG. 2 and the diagram in FIG. 1, oscillator 10 comprises the two two-input NAND gates 33 and 34. The RC-time constant of resistor R16 and capacitor C5 determine the frequency of oscillation or more precisely the repetition rate of the square-wave output at 35. (Although there are innumerable oscillator circuit designs which would be suitable in this application, the two NAND gate design was adopted since the gates were available in the same commercial package as multivibrator 20.) For reasons of clarity the bias circuitry for the gates and other logic circuitry is not shown.

The oscillator output on path 35 drives the base of transistor Q1 through resistor R15. Transistor Q1 is driven alternately into saturation and cut-off by the oscillator output signal causing it to act as a switch. The collector current of transistor Q1 drives the LEDs (light emitting diodes) of L1 and L2 through resistors R1 and R5 to the supply voltage connections designated throughout the figure as +V. When transistor Q1 is driven out of cut-off a bias current flows through resistors R1 and R5 to turn ON the LEDs. Thus the light sources are modulated (i.e. pulsed ON and OFF) by the (7600 Hz) square-wave output of the oscillator.

The modulated beams normally reflect off of the rotor surface into the receiving photo-transistors of L1 and L2. The value of the DC bias resistors R2 and R6 determine the dynamic range of the optical receivers. With resistors R2 and R6 equal to 1000 ohms the active operating range of the collector current is between 1 uA and 6.5 mA with a 6.5 V DC supply voltage. The wide dynamic range of the receiver prevents saturation under the effects of all but very intense ambient (or interference) light sources. The effect of ambient light is to move the steady state operating point of the receiver. The modulated light signal is superimposed on any steady ambient light level. A 100 mV AC signal is typical at capacitors C1 and C2. The received signal in the top and bottom paths is connected respectively through capacitors C1 and C2 which in combination with resistors R4 and R8 respectively form a simple high pass filter section. This filter blocks the steady state (DC) current component which would be generated as a result of ambient light or other interference. This mechanism provides a high degree of immunity to ambient light or infra-red jamming. The high frequency signal component is conveyed via resistors R3 and R7 to the non-inverting inputs 36 and 39 of operational amplifiers 31 and 32. Feedback resistors R9 and R10 give a small amount of hysteresis (about 2 mV) to eliminate the potential of switching on noise. The inverting inputs 37 and 38 of amplifiers 31 and 32 are connected to the voltage divider R17 and R18 which provides a bias voltage equal to half the supply voltage. (Capacitor C6 provides filtering for inputs 37 and 38.) The received signals at 36 and 39 are amplified by 31 and 32 to produce a square-wave oscillating between the ground potential and the supply voltage +V.

When a reflective surface is above the emitter-sensor of phototransistors of L1 or L2 the light from the LED's is reflected and a received signal is detected. When a non-reflective surface is above an emitter-sensor, no reflection occurs and the AC output signal is zero.

Figure 3:
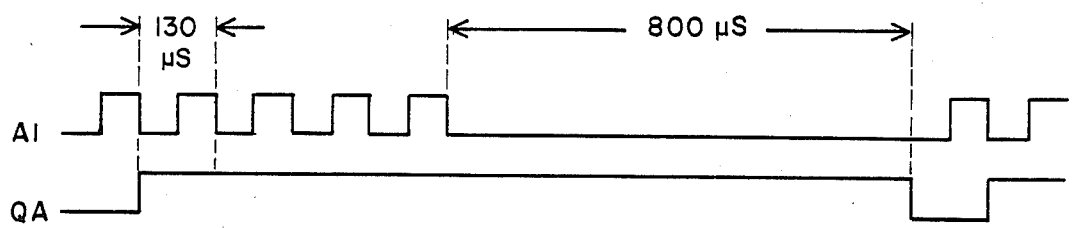
FIG. 3 is a waveform diagram useful in understanding the operation of the circuit of FIG. 2.

The amplified square-wave derived from the received signal is supplied to inputs A1 and A3 to two retriggerable monostable multivibrators (A and B) contained in 40. The time delay of each multivibrator in 40 is set to about 800 microseconds (as defined by R11-C3 and R12-C4). If the time between successive falling edges of the received signal is smaller than the time constant of the multivibrator, then the multivibrator is continuously retriggered and its Q output remains in the high state (FIG. 3). If the time between successive falling edges is longer than 800 microseconds, the multivibrator is not retriggered and the output goes low. This operation is shown more clearly in FIG. 3. The top waveform depicts a typical signal waveform at the output of op amp 31. And, the bottom waveform shows the Q output of the A monostable. As the A1 input cycles back and forth at the rep. rate of the square-wave modulation, the A monostable is triggered high at the first high-to-low input transistion. But when the A1 input stays low for longer than the preset time delay (e.g. 800 microseconds), the Q output switches states from high to low. Then when the square-wave modulation is again received at the A1 input, its Q output switches back high. (The lower path B monostable performs an equivalent operation.) In other words when a reflective surface is present below both sensors L1 and L2, both monostable multivibrators A and B are continuously retriggered, causing their outputs to remain high. When a non-reflective area passes below a sensor, the loss of light signal prevents retriggering of the associated monostable, allowing its output to drop low.

The Q outputs of the multivibrators in 40 are connected to inputs 51 and 56 of an R-S (set-reset) flip-flop formed from the two NAND gates 50 and 52. A low signal on one of the Q outputs of the multivibrator will change the state of the flip-flop, and a low signal on the other monostable Q output will restore the original state of the flip-flop. In order to produce a complete output pulse, a non-reflective area must traverse both sensors. In traversing the first sensor, the output is set low, in traversing the other, the output is set high. This order of operation prevents the circuit from producing false pulses due to vibration or mechanical hysteresis.

The outputs of the set reset flip-flop drive the bases of transistors Q2 and Q3 through resistors R13 and R14. The collectors of the Q2 and Q3 transistors are the outputs of the pulse initiator. If the current output state of NAND gate 50 is high, then Q2 is ON and Q3 OFF. Conversely, if the state of the RS flip-flop is such that NAND gate 52 is high, then Q3 is ON and Q2 OFF.

Although the circuit shown in FIG. 2 was designed for a specific operation, there are numerous design changes that could be made without departing from the spirit of the invention. For example the output stage 21 could be eliminated if multivibrator 20 (NAND gates 50 and 52) was designed to produce a single pulse upon receiving a transistion from one input then the other.

In addition although the pulse initiator shown in FIG. 2 was designed specifically for use with electric power meters, it can be used in any application which requires the conversion of rotary motion into a serial pulse train of electrical pulses.

By way of example, the circuit shown in FIG. 2 was designed with the following component values and has the electrical characteristics listed.

| | |
|---|---|
| R1 = 680 ohms | R9, R10 = 10 M ohms |
| R2 = 1k | R11, R12 = 120k |
| R3 = 10k | R13, R14 = 3.6k |
| R4 = 10k | R15 = 3.6k |
| R5 = 680 | R16 = 36k |
| R6 = 1k | R17, R18 = 10k |
| R7 = 10k | C1, C2 = 10 nF |
| R8 = 10k | C3, C4 = 22 n |
| | C5 = 2.2 n |
| | C6 = 2.2 u |

L1 and L2 are commercially available as SPX 1404-2 Infared Switch made by Honeywell Corporation.

What is claimed is:

1. An optical scanner/pulse initiator for electric power meters of a type having a rotor that may be marked with a non-reflective coating, said scanner comprising:
    first and second light source means respectively having first and second light beams capable of being modulated ON and OFF, said first and second beams positioned to reflect off of spatially separated points on said rotor such that when said rotor rotates said non-reflective mark will traverse said spatially separated points;
    oscillator means for modulating said first and second light source means ON and OFF at a rate R and with an OFF period of P;
    first light sensor means positioned to receive said first light beam after being reflected by said rotor, said first light sensor means providing an indication when the period of time said first beam is OFF is greater than P;
    second light sensor means positioned to receive said second light beam after being reflected by said rotor, said second light sensor means providing an indication when the period of time said second beam is OFF is greater than P;
    output means responsive to said first and second light sensor means and providing an output signal upon receiving said indication from each of said first and second light sensor means.

2. A scanner according to claim 1 wherein said first light sensor means further comprises:
    first light receiver means receiving said reflected first light beam and providing in response thereto a first output signal having an ON/OFF period equal to the ON/OFF period of said reflected first light beam; and
    first detector means receiving said first output signal from said first light receiver means and providing a first pulse output when the OFF period of said first output signal from said first light receiver means is greater then P.

3. A scanner according to claim 2 wherein said second light sensor means further comprises:
    second light receiver means receiving said reflected second light beam and providing in response thereto a second output signal having an ON/OFF period equal to the ON/OFF period of said second light beam; and
    second detector means receiving said second output signal from said second light receiver means and providing a second pulse output when the OFF period of said second output signal from said second light receiver means is greater then P.

4. A scanner according to claim 1 wherein said first and second light source means further comprises first and second light emitting diodes each having a bias circuit connected to said oscillator means and each having a bias current modulated ON and OFF in response to said oscillator means.

5. A scanner according to claim 4 wherein said first light receiver means further comprises a first phototransistor responsive to the light from said first light emitting diode.

6. A scanner according to claim 5 wherein said second light receiver means further comprises a second photo-transistor responsive to the light from said second light emitting diode.

7. A method of deriving power consumption data from a power meter having a rotating rotor comprising:
    marking said rotor with a non-reflective coating;
    reflecting first and second light beams off of spatially separated points on said rotor so that as said rotor rotates said non-reflective marking will traverse said spatially separated points;
    modulating said first and second light beams ON and OFF at a rate R and with an OFF period P;
    sensing said first light beam after being reflected off of said rotor and generating a first indication signal when said first beam is OFF for a period of time greater than P;
    sensing said second light beam after being reflected off of said rotor and generating a second indication signal when said second beam is OFF for a period of time greater than P; and
    generating an output pulse when both first and second indication signals are generated.

8. The method according to claim 7 with said marking step further comprising marking said rotor with a narrow stripe of non-reflective coating extending out radially on said rotor.

9. A scanner according to claim 2 further comprising first filter means connecting said first light receiver means to said first detector means for passing AC signals having the repetition rate R and for attenuating other signals.

10. A scanner according to claim 3 further comprising second filter means connecting said second light receiver means to said second detectors for passing AC signals having the repetition rate R and for attenuating other signals.

11. A scanner according to claim 4 wherein said oscillator means further comprises a square-wave generator having a repetition rate R with an OFF period P.

12. An optical scanner/pulse initiator for an electric power meter of a type having a rotor that may be marked with a non-reflective coating, said scanner comprising:
    first and second light source means respectively having first and second light beams capable of being modulated ON and OFF, said first and second beams positioned to reflect off of spatially separated points on said rotor such that when said rotor rotates said non-reflective mark will traverse said spatially separated points;
    means for modulating said first and second light source means ON and OFF at a repetition rate R with an OFF period P;
    first light receiver means positioned to receive said first light beam after being reflected by said rotor, said first light receiver means providing a first state indication when said first light beam is received and providing a second state indication when said first light beam is not received for a period of time much greater than P;

second light receiver means positioned to receive said second light beam after being reflected by said rotor, said second light receiver means providing a first state indication when said second light beam is received and providing a second state indication when said second light beam is not received for a period of time much greater than P;

output means responsive to said first and second light receiver means and providing an output power consumption signal upon sequentially receiving said second state indication from each of said light receiver means.

* * * * *